(12) United States Patent
Kim

(10) Patent No.: US 7,667,528 B2
(45) Date of Patent: Feb. 23, 2010

(54) INTERNAL VOLTAGE GENERATOR OF SEMICONDUCTOR INTEGRATED CIRCUIT

(75) Inventor: Kyung-Whan Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/185,448

(22) Filed: Aug. 4, 2008

(65) Prior Publication Data

US 2009/0033406 A1 Feb. 5, 2009

Related U.S. Application Data

(63) Continuation of application No. 11/519,829, filed on Sep. 13, 2006, now Pat. No. 7,417,490.

(30) Foreign Application Priority Data

Sep. 13, 2005 (KR) .................. 10-2005-0085165

(51) Int. Cl.
*G05F 1/10* (2006.01)

(52) U.S. Cl. .................. 327/534; 327/513
(58) Field of Classification Search .......... 327/512, 327/513, 534, 535, 536, 537, 538, 539
See application file for complete search history.

(56) References Cited

U.S. PATENT DOCUMENTS

| 5,315,230 | A | 5/1994 | Cordoba et al. |
| 5,532,579 | A | 7/1996 | Park |
| 5,686,825 | A | 11/1997 | Suh et al. |
| 6,082,115 | A | 7/2000 | Strnad |
| 6,232,828 | B1 | 5/2001 | Smith et al. |
| 6,791,308 | B2 | 9/2004 | Shim |
| 6,814,485 | B2 * | 11/2004 | Gauthier et al. ............. 374/170 |
| 2005/0237104 | A1 | 10/2005 | Chou |

FOREIGN PATENT DOCUMENTS

| JP | 2003-197764 | 7/2003 |
| KR | 1020010017280 | 3/2001 |
| KR | 1020060017018 | 2/2006 |

* cited by examiner

*Primary Examiner*—Jeffrey S Zweizig
(74) *Attorney, Agent, or Firm*—Venable LLP; Jeffri A. Kaminski

(57) ABSTRACT

The internal voltage generator of a semiconductor integrated circuit includes at least one variable reference voltage generating unit that generates a base reference voltage increased or decreased according to the variation in temperature, at least one level shifting unit that transforms the base reference voltage outputted by the at least one variable reference voltage generating unit into at least one prescribed reference voltage for generating internal voltage and outputs the transformed reference voltage, and at least one internal voltage generating unit that generates an internal voltage by using the at least one reference voltage for generating internal voltage outputted by the at least one level shifting unit.

18 Claims, 9 Drawing Sheets

INTERNAL VOLTAGE GENERATOR OF SEMICONDUCTOR INTEGRATED CIRCUIT

This application is a continuation of U.S. patent application Ser. No. 11/519,829, filed Sep. 13, 2006, now U.S. Pat. No. 7,417,490, the subject matter of which application is incorporated herein by reference in its entirety.

BACKGROUND OF THE INVENTION

1. Technical Field

The present invention relates to a semiconductor integrated circuit, and more particularly, to an internal voltage generator of a semiconductor integrated circuit.

2. Related Art

In recent years, an external voltage VDD, which is supplied to a semiconductor integrated circuit, in particular, a DRAM (Dynamic Random Access Memory), has been lowered. Accordingly, maximum suppression of a variation in internal power due to the variation in temperature is required. Furthermore, controlling the direction in which each internal power varies (positive or negative direction) to a desired direction is required.

Generally, in a basic memory cell structure of a DRAM, one transistor and one capacitor are connected to a word line and a bit line, as shown in FIG. 1. For the transistor used in the DRAM, an NMOS transistor is typically used, which is superior to a PMOS transistor in performance over size.

FIG. 2 illustrates a comparison between levels of voltages used in the DRAM. According to the comparison, the respective voltage levels are, in the order of largest to smallest, VPP, VDD, VCORE, VBLP & VCP, and VBB.

The voltage VDD is a voltage that is supplied from the exterior of the DRAM, and the voltages VPP, VCORE, VBLP & VCP, and VBB are generated by increasing or decreasing the voltage VDD. The voltage VPP is used in a word line driver, a data out driver, or the like to compensate for a loss of a threshold voltage VT of a transistor that is an element of a memory cell. The voltage VPP is generated by increasing the voltage VDD, and it is a larger voltage (largest value among internal voltages) than the voltage VCORE+the threshold value VT. The voltage VCORE is a voltage that corresponds to a cell voltage, that is, a data level of a cell. The voltage VBLP corresponds to a bit line precharge voltage, and the voltage VCP is a cell plate voltage and has the same level as the voltage VBLP. In addition, the voltage VBB corresponds to a substrate bias voltage, and it is applied to a bulk of the transistor with a negative value.

Hereinafter, an internal voltage generating circuit of a semiconductor integrated circuit will be described with reference to the accompanying drawings.

FIG. 3 is a circuit diagram illustrating an internal voltage generating circuit of a semiconductor integrated circuit according to the related art. FIG. 4 is a circuit diagram illustrating an internal structure of a substrate bias voltage detector shown in FIG. 3. FIG. 5 is a circuit diagram illustrating an internal structure of an elevated voltage detector shown in FIG. 3. FIG. 6 is a graph illustrating a variation in reference voltage in accordance with the related art. FIG. 7 is a graph illustrating an internal voltage requiring condition at a low temperature.

As shown in FIG. 3, the internal voltage generating circuit of the semiconductor integrated circuit according to the related art includes a reference voltage generating unit 10 that generates a base reference voltage VREF_BASE when an external voltage VDD increases to reach a predetermined level; a level shifter 11 that transforms the base reference voltage VREF_BASE into a first reference voltage VREF_C for generating a cell voltage and a substrate bias voltage, and a second reference voltage VREF_P for generating an elevated voltage, and outputs them; a cell voltage generating unit 12 that generates a cell voltage VCORE by using the first reference voltage VREF_C; a substrate bias voltage generating unit 13 that generates a substrate bias voltage VBB by using the first reference voltage VREF_C; and an elevated voltage generating unit 14 that generates an elevated voltage VPP by using the second reference voltage VREF_P.

The level shifter 11 has the structure of a differential comparator. In the level shifter 11, the base reference voltage VREF_BASE and a voltage VR divided by the resistors R1 and R2, are two input signals that are maintained at the same value through a feedback operation. The first reference voltage VREF_C is determined by the resistance ratio between the resistors R1 and R2. In addition, the second reference voltage VREF_P is generated by adjusting the resistance ratio, as in the first reference voltage VREF_C. For example, a plurality of resistors that have smaller resistance values than the resistors R1 and R2 are connected to one another, and the second reference voltage VREF_P is outputted from a node, which is selected among a plurality of nodes and outputs a desired voltage.

The cell voltage generating unit 12 includes a comparator 12-1 that has an inversion terminal "−" receiving the first reference voltage VREF_C, and a transistor 12-2 that has a gate receiving the output of the comparator 12-1, and outputs a cell voltage VCORE by transforming an external voltage VDD according to the gate voltage level while feeding the cell voltage back to a non-inversion terminal "+" of the comparator 12-1. This is the way in which the cell voltage generating unit 12 operates in order to maintain the level of the cell voltage VCORE at a predetermined value. The cell voltage generating unit 12 compares the first reference voltage VREF_C with the cell voltage VCORE, and turns on the transistor 12-2 when the cell voltage VCORE decreases to a voltage not more than the first reference voltage VREF_C, such that the cell voltage generating unit 12 is supplied with an external voltage VDD to increase the cell voltage VCORE. Further, when the cell voltage VCORE becomes a voltage not less than the first reference voltage VREF_C, the cell voltage generating unit 12 turns off the transistor 12-2, such that the cell voltage VCORE is no longer increased.

Furthermore, the substrate bias voltage generating unit 13 includes a comparator 13-1, a transistor 13-2, a substrate bias voltage detector 13-3 that detects the level of a voltage VCORE_BB outputted by the transistor 13-2 and outputs a substrate bias voltage pump enable signal, and a substrate bias voltage pump 13-4 that is driven by the substrate bias voltage pump enable signal and pumps the substrate bias voltage VBB. The connection between the comparator 13-1 and the transistor 13-2 is the same as the cell voltage generating unit 12. However, although the level of the voltage VCORE_BB is the same as the level of the cell voltage VCORE, since the amount of consumed current is smaller in the substrate bias voltage generating unit 13, the voltage VCORE_BB is different from the cell voltage VCORE in that the sizes of the comparator 13-1 and the transistor 13-2 in the substrate bias voltage generating unit 13 are smaller than those in the cell voltage generating unit 12.

In addition, the substrate bias voltage detector 13-3 has the structure shown in FIG. 4. If an absolute value of the substrate bias voltage VBB decreases, a resistance component of lower transistor 13-5 1 increases. As a result, the substrate bias voltage detector 13-3 causes a potential at a node 'DET' to become a high level and thus causes a potential of a signal 'BB_ENb1' to become a low level. The signal 'BB_ENb1' is a signal that swings between the voltage VCORE_BB outputted by the transistor 13-2 and the ground voltage VSS. The level shifter 13-6 transforms the signal 'BB_Enb1' into a substrate bias voltage pump enable signal 'BB_ENb2' that swings between the external voltage VDD and the ground voltage VSS. When the signal 'BB_ENb2' becomes a low level, the substrate bias voltage pump 13-4 operates.

When the first reference voltage VREF_C is increases for any reason, the potential of the 'DET' node also increases. Due to this, in order to allow the potential at the 'DET' node to become a low level, the absolute value of the substrate bias voltage VBB should be further increased. As a result, the absolute value of the substrate bias voltage VBB is increased.

The elevated voltage generating unit 14 includes an elevated voltage detector 14-1 that outputs an elevated voltage pump enable signal by detecting the level of the second reference voltage VREF_P, and an elevated voltage pump 14-2 that is driven by the elevated voltage pump enable signal and pumps the elevated voltage VPP. The elevated voltage detector 14-1 has a structure as shown in FIG. 5. That is, a voltage at an 'X node' and a second reference voltage VREF_P are inputted to two input terminals of the differential comparator (transistors 14-3, 14-4). The 'X node' corresponds to a node at which a resistance is distributed such that it has the same potential as the second reference voltage VREF_P when the elevated voltage VPP is a target value. Therefore, when the elevated voltage VPP becomes lower than the target value, since the voltage at the 'X node' also becomes lower than the second reference voltage VREF_P, an elevated voltage pump enable signal 'PP_EN' becomes a high level through the operation of the comparator, such that the elevated voltage pump 14-2 pumps the elevated voltage VPP.

In the case in which the second reference voltage VREF_P for generating an elevated voltage increases for any reason, in the elevated voltage detector 14-1, the elevated voltage VPP becomes larger than an original target value, which causes the level of the elevated voltage pump enable signal 'PP_EN' to become a low level. As a result, the elevated voltage VPP is increased.

At this time, as shown in FIG. 6, when the base reference voltage VREF_BASE varies, the second reference voltage VREF_P outputted by the level shifter 11 also varies. That is, when the base reference voltage VREF_BASE decreases, the second reference voltage VREF_P for generating the elevated voltage also decreases.

In the meantime, in low temperature conditions (at a cold temperature, for example, −10° C.), the threshold value $V_{TN}$ of the NMOS transistor increases even when the elevated voltage VPP, the cell voltage VCORE, and the substrate bias voltage VBB are constant, which results in lowering the current drivability of the NMOS transistor. Therefore, as shown in FIG. 7, in low temperature conditions, increasing the elevated voltage VPP and the cell voltage VCORE and decreasing the substrate bias voltage VBB (hereinafter, the decrease of the substrate bias voltage VBB refers to the reduction of the absolute value) are effective in normal operation of the semiconductor integrated circuit.

However, according to the related art, the corresponding internal voltages are generated by using the reference voltage generated from the source without considering variations according to the temperature condition. Therefore, if the corresponding internal voltages, that is, the elevated voltage VPP and the cell voltage VCORE are increased by increasing the reference voltages VREF_P and VREF_C in low temperature conditions, the substrate bias voltage VBB that should be lower than the corresponding level or maintained at the corresponding level also increases (hereinafter, the increase of the substrate bias voltage VBB refers to the increase of the absolute value). As a result, the semiconductor integrated circuit element experiences a decrease in performance.

SUMMARY OF THE INVENTION

Embodiments of the present invention provide an internal voltage generator of a semiconductor integrated circuit which is capable of controlling each internal voltage level according to each temperature condition and preventing a decrease in the performance of the semiconductor integrated circuit.

According to a first embodiment of the present invention, an internal voltage generator of a semiconductor integrated circuit includes at least one variable reference voltage generating unit that generates a base reference voltage increased or decreased according to the variation in temperature; at least one level shifting unit that transforms the base reference voltage, outputted by the at least one variable reference voltage generating unit, into at least one predetermined reference voltage for generating internal voltage and outputs the transformed reference voltage, and at least one internal voltage generating unit that generates an internal voltage by using the at least one reference voltage for generating internal voltage outputted by the at least one level shifting unit.

According to a second embodiment of the present invention, an internal voltage generator of a semiconductor integrated circuit is provided that uses a cell voltage VCORE, an elevated voltage VPP, and a substrate bias voltage VBB generated by transforming external voltages applied from the exterior of the semiconductor integrated circuit as internal voltages. The internal voltage generator of a semiconductor integrated circuit includes a temperature-inverse-proportion-type reference voltage generating unit that generates a base reference voltage increased according to a decrease in temperature; a first level shifting unit that transforms the base reference voltage, outputted by the temperature-inverse-proportion-type reference voltage generating unit, into a cell voltage generating reference voltage and an elevated voltage generating reference voltage and outputs the transformed reference voltages; a first internal voltage generating unit that generates the cell voltage and the elevated voltage by using the cell voltage generating reference voltage and the elevated voltage generating reference voltage outputted by the first level shifting unit; a temperature-proportion-type reference voltage generating unit that generates a base reference voltage decreased according to a decrease in temperature; a second level shifting unit that transforms the base reference voltage outputted by the temperature-proportion-type reference voltage generating unit into a substrate bias voltage generating reference voltage and outputs the transformed reference voltage; and a second internal voltage generating unit that generates the substrate bias voltage by using the substrate bias voltage generating reference voltage outputted by the second level shifting unit.

According to a third embodiment of the present invention, an internal voltage generator of a semiconductor integrated circuit is provided that uses a cell voltage VCORE, an elevated voltage VPP, and a substrate bias voltage VBB generated by transforming an external voltage applied from the exterior of the semiconductor integrated circuit as internal voltages. The internal voltage generator of a semiconductor integrated circuit includes a temperature-independent-type reference voltage generating unit that generates a base reference voltage of a predetermined level, regardless of the variation in temperature; a first level shifting unit that transforms the base reference voltage outputted by the temperature-independent-type reference voltage generating unit, into a cell voltage generating reference voltage and an elevated voltage generating reference voltage and outputs the transformed reference voltages; a first internal voltage generating unit that generates the cell voltage and the elevated voltage by using the cell voltage generating reference voltage and the elevated voltage generating reference voltage outputted by the first level shifting unit; a temperature-proportion-type reference voltage generating unit that generates a base reference voltage decreased according to a decrease in temperature; a second level shifting unit that transforms the base reference voltage outputted by the temperature-proportion-type reference voltage generating unit, into a substrate bias voltage generating reference voltage and outputs the transformed reference voltage; and a second internal voltage generating unit that generates the substrate bias voltage by using the substrate bias voltage generating reference voltage outputted by the second level shifting unit.

According to a fourth embodiment of the present invention, an internal voltage generator of a semiconductor integrated circuit is provided that uses a cell voltage VCORE, an elevated voltage VPP, and a substrate bias voltage VBB generated by transforming external voltages applied from the exterior of the semiconductor integrated circuit as internal voltages. The internal voltage generator of a semiconductor integrated circuit includes a temperature-inverse-proportion-type reference voltage generating unit that generates a base reference voltage increased according to a decrease in temperature; a first level shifting unit that transforms the base reference voltage, outputted by the temperature-inverse-proportion-type reference voltage generating unit, into a cell voltage generating reference voltage and an elevated voltage generating reference voltage and outputs the transformed reference voltages; a first internal voltage generating unit that generates the cell voltage and the elevated voltage by using the cell voltage generating reference voltage and the elevated voltage generating reference voltage outputted by the first level shifting unit; a temperature-independent-type reference voltage generating unit that generates a base reference voltage of a predetermined level, regardless of the variation in temperature; a second level shifting unit that transforms the base reference voltage, outputted by the temperature-independent-type reference voltage generating unit, into a substrate bias voltage generating reference voltage and outputs the transformed reference voltage; and a second internal voltage generating unit that generates the substrate bias voltage by using the substrate bias voltage generating reference voltage outputted by the second level shifting unit.

BRIEF DESCRIPTION OF THE DRAWINGS

Embodiments of the present invention will be described with reference to the accompanying drawings, wherein like numbers reference like elements, in which.

DESCRIPTION OF EXEMPLARY EMBODIMENTS

Before the preferred embodiments of the present invention will be described, an embodiment according to the basic concepts of the present invention will be described with reference to FIG. 8.

Figure 1:
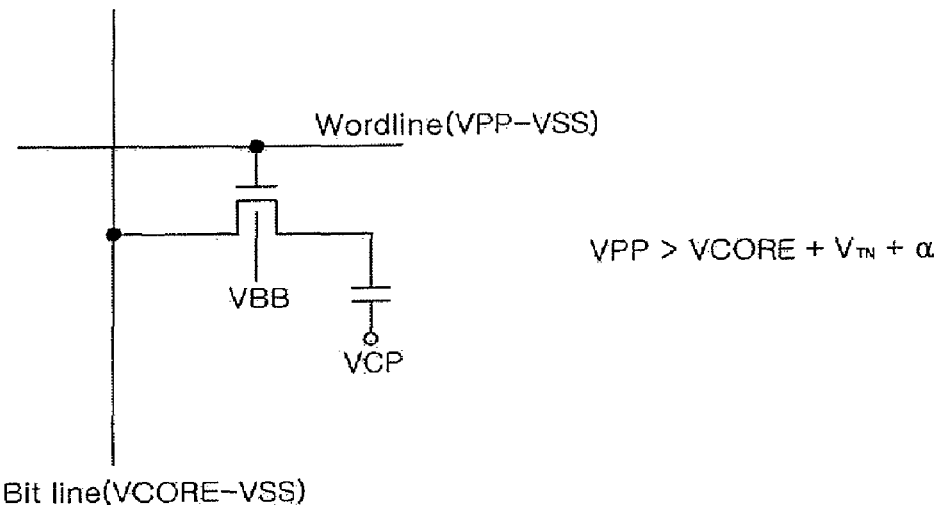
FIG. 1 is a layout diagram illustrating a structure of a conventional memory cell.
Figure 2:
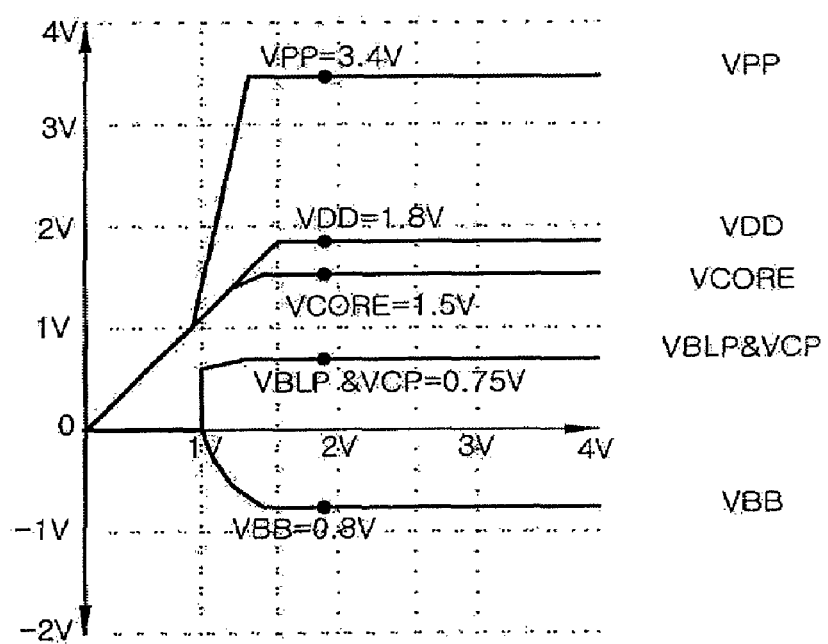
FIG. 2 is a graph illustrating the comparison among voltages used in a conventional semiconductor integrated circuit.
Figure 3:
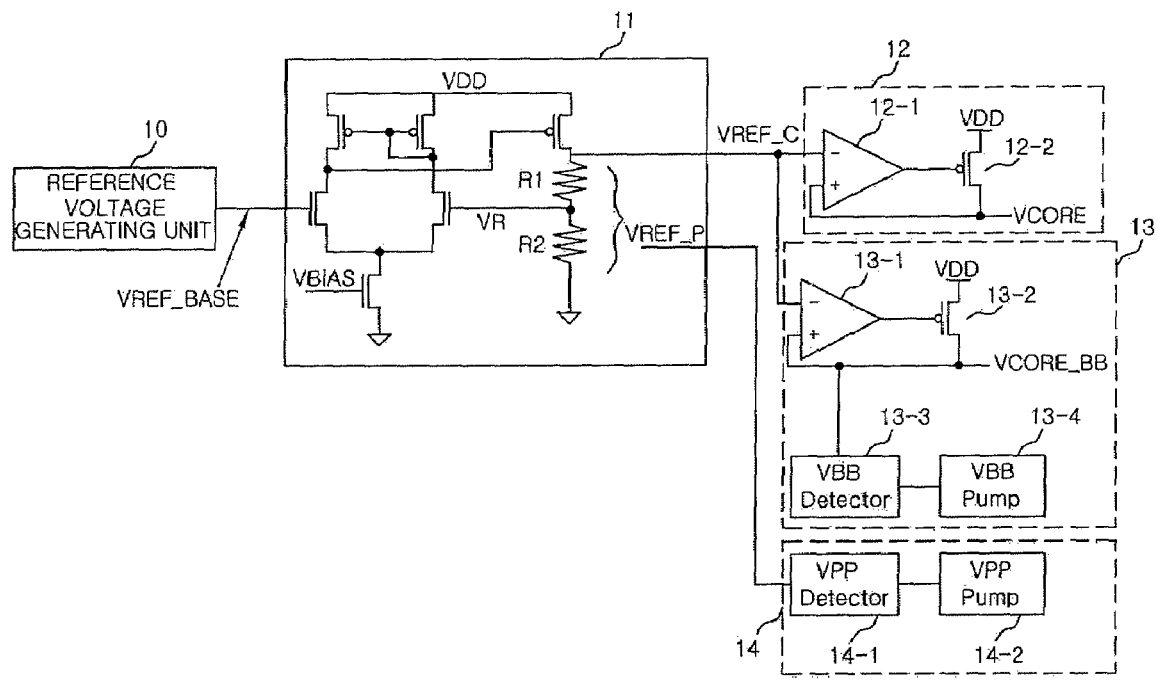
FIG. 3 is a circuit diagram illustrating an internal voltage generating circuit of a semiconductor integrated circuit according to the related art.
Figure 4:
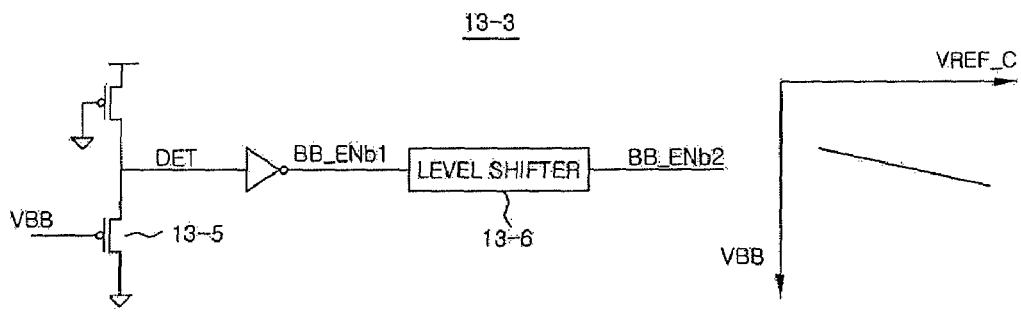
FIG. 4 is a circuit diagram illustrating an internal structure of a substrate bias voltage detector shown in FIG. 3.
Figure 5:
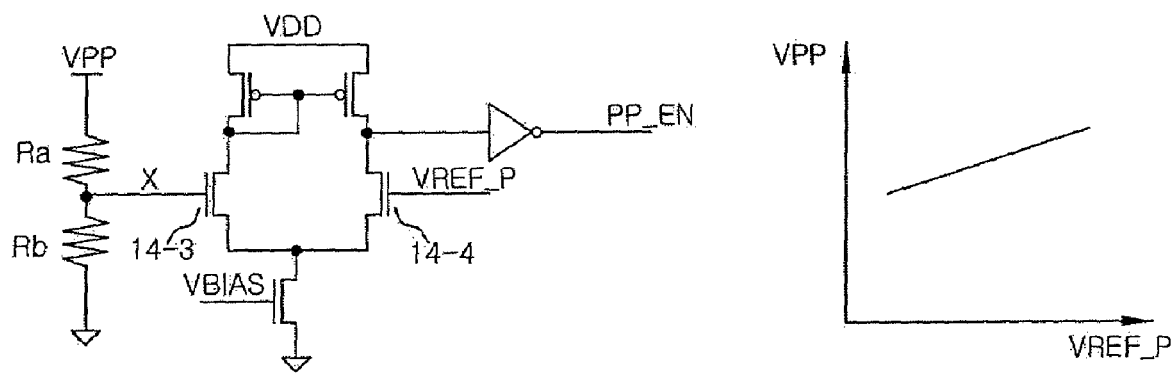
FIG. 5 is a circuit diagram illustrating an internal structure of an elevated voltage detector shown in FIG. 3.
Figure 6:
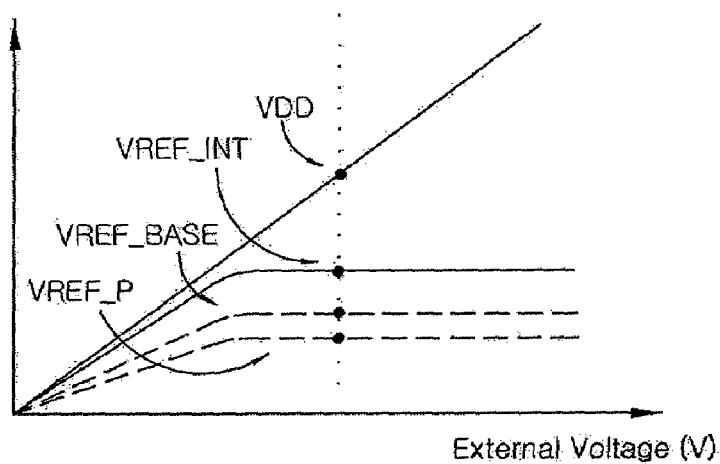
FIG. 6 is a graph illustrating a variation in reference voltages in accordance with the related art.
Figure 7:
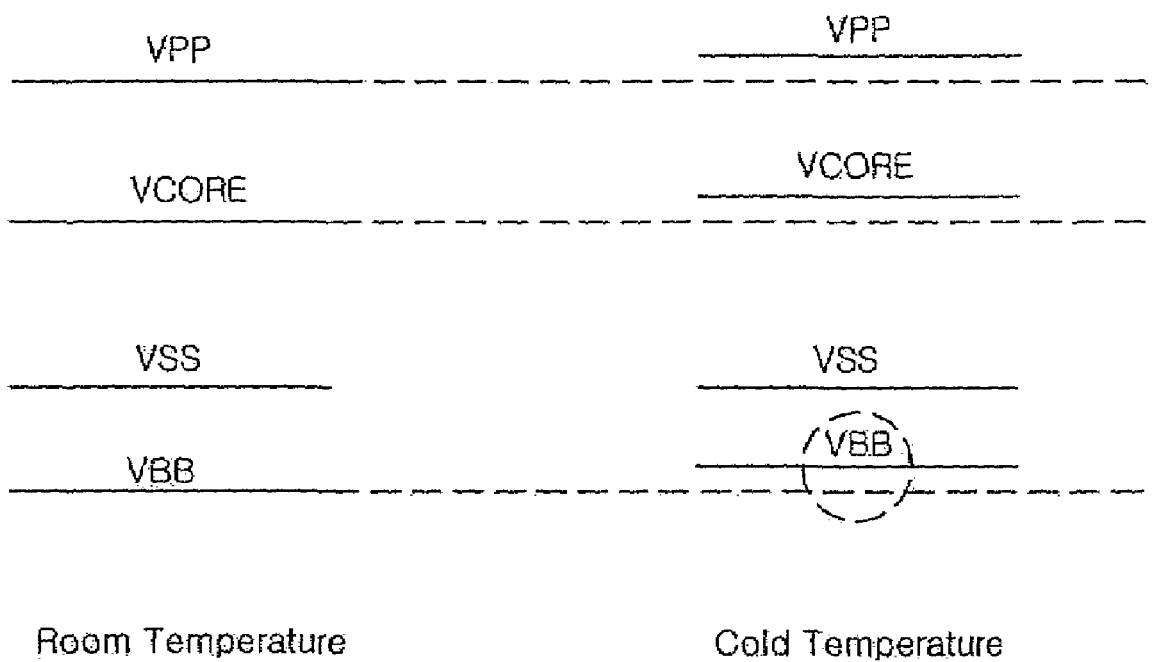
FIG. 7 is a graph illustrating an internal voltage requiring condition at a low temperature.
Figure 8:
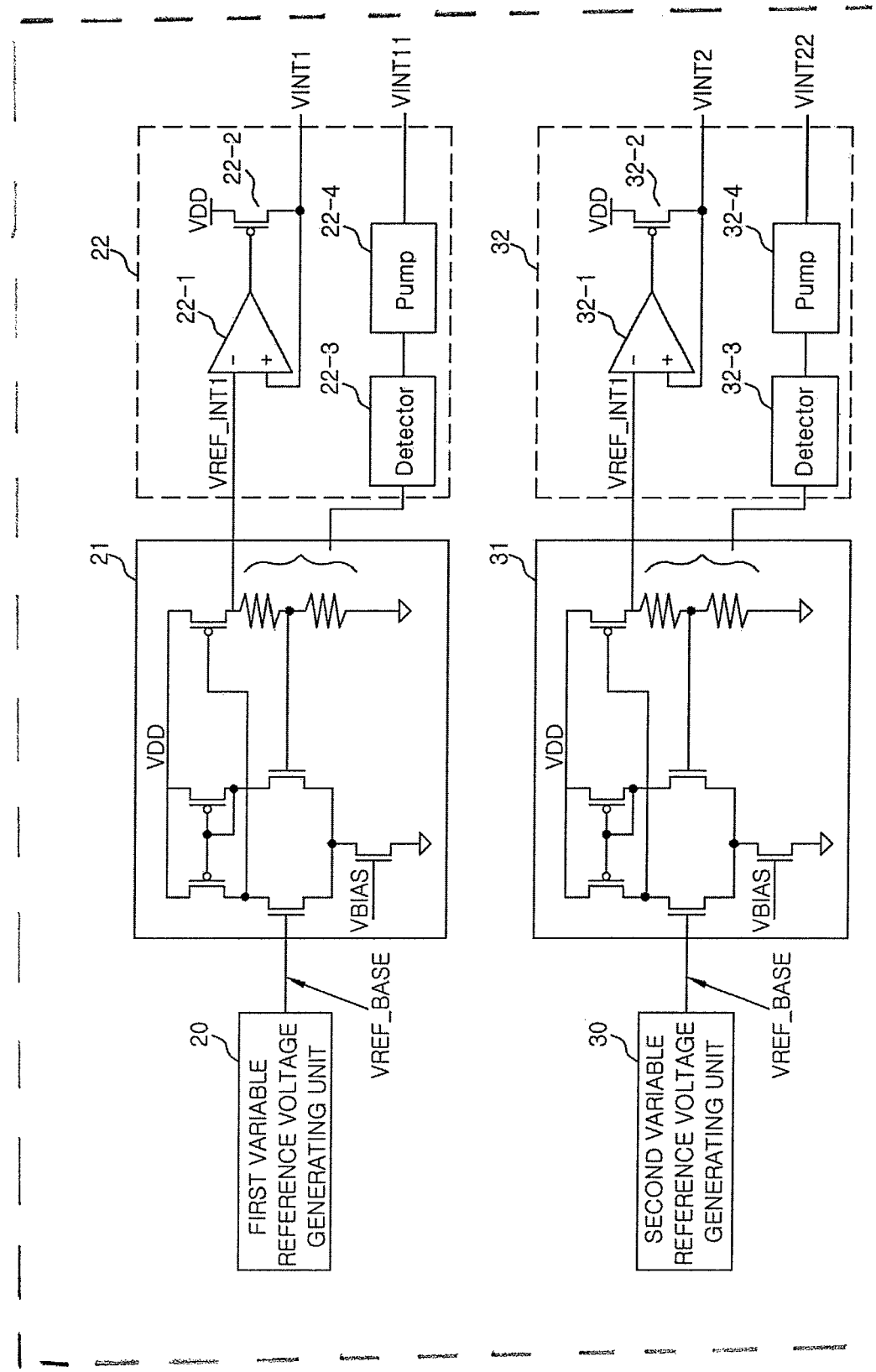
FIG. 8 is a circuit diagram illustrating an internal voltage generator of a semiconductor integrated circuit according to an embodiment of the present invention.

As shown in FIG. 8, an internal voltage generator of a semiconductor integrated circuit according to an embodiment of the present invention includes a first variable reference voltage generating unit 20 that generates any one of: a base reference voltage increased according to a variation in temperature, a base reference voltage decreased according to the variation in temperature, and a base reference voltage having a predetermined level, regardless of the variation in temperature; a first level shifter 21 that transforms the base reference voltage, outputted by the first variable reference voltage generating unit 20, into at least one predetermined reference voltage for generating internal voltage and outputs that reference voltage; a first internal voltage generating unit 22 that generates an internal voltage, by using at least one reference voltage for generating internal voltage outputted by the first level shifter 21; a second variable reference voltage generating unit 30 that generates any one of: a base reference voltage increased according to the variation in temperature, a base reference voltage decreased according to the variation in temperature, and a base reference voltage having a predetermined level, regardless of the variation in temperature; a second level shifter 31 that transforms the base reference voltage, outputted by the second variable reference voltage generating unit 30, into at least one predetermined reference voltage for generating internal voltage and outputs that reference voltage; and a second internal voltage generating unit 32 that generates an internal voltage by using at least one reference voltage for generating internal voltage outputted by the second level shifter 31.

Each of the first variable reference voltage generating unit 20 and the second variable reference voltage generating unit 30 is composed of any one of a temperature-proportion-type reference voltage generating unit, a temperature-inverse-proportion-type reference voltage generating unit, and a temperature-independent-type reference voltage generating unit, depending on whether a corresponding internal voltage is increased, decreased, or maintained to improve the operation of the device in a corresponding temperature condition.

The temperature-proportion-type reference voltage generating unit decreases its output level according to a decrease in temperature, the temperature-inverse-proportion-type reference voltage generating unit increases its output level according to a decrease in temperature, and the temperature-independent-type reference voltage generating unit maintains a predetermined output level, regardless of the variation in temperature.

That is, each of the first variable reference voltage generating unit 20 and the second variable reference voltage generating unit 30 is composed of the temperature-inverse-proportion-type reference voltage generating unit when it is required that an internal voltage be increased in a specific temperature condition, that is, a low temperature condition. Further, each of the first variable reference voltage generating unit 20 and the second variable reference voltage generating unit 30 is composed of the temperature-proportion-type reference voltage generating unit when it is required that an internal voltage be decreased in a low temperature condition. Furthermore, each of the first variable reference voltage generating unit 20 and the second variable reference voltage generating unit 30 is composed of the temperature-independent-type reference voltage generating unit when it is required that an internal voltage be maintained, regardless of the variation in temperature.

Specifically, in a case in which the first variable reference voltage generating unit 20 is composed of a temperature-inverse-proportion-type reference voltage generating unit, a base reference voltage VREF_BASE is increased during operation in a low temperature condition and the increased base reference voltage is output. Therefore, internal voltages VINT1 and VINT11, which are outputted by the first internal voltage generating unit 22, are also outputted with voltage levels increased from an original voltage level.

Further, in the case in which the first variable reference voltage generating unit 20 is composed of a temperature-proportion-type reference voltage generating unit, the base reference voltage VREF_BASE and the internal voltages VINT1 and VINT11 are decreased during operation in a low temperature condition and the decreased base reference voltage and internal voltages are output. Furthermore, in a case in which the first variable reference voltage generating unit 20 is composed of a temperature-independent-type reference voltage generating unit, the base reference voltage VREF_BASE and the internal voltages VINT1 and VINT11 are maintained at the original voltage levels, regardless of the variation in temperature.

The embodiment of the present invention shown in FIG. 8 exemplifies a set of the variable reference voltage generating unit 20, the first level shifter 21, and the first internal voltage generating unit 22, and a set of the second variable reference voltage generating unit 30, the second level shifter 31, and the second internal voltage generating unit 32. However, it should be understood that the above-described embodiment is not limitative, but illustrative in all aspects. The number of sets may be increased or decreased according to the number of necessary internal voltages. Since specific embodiments of the present invention will be described later, the detailed description of the structure of FIG. 8 will be omitted.

Examples of the temperature-proportion-type reference voltage generating unit, the temperature-inverse-proportion-type reference voltage generating unit or the temperature-independent-type reference voltage generating unit will be described in detail with reference to FIGS. 9 and 10.

Figure 9:
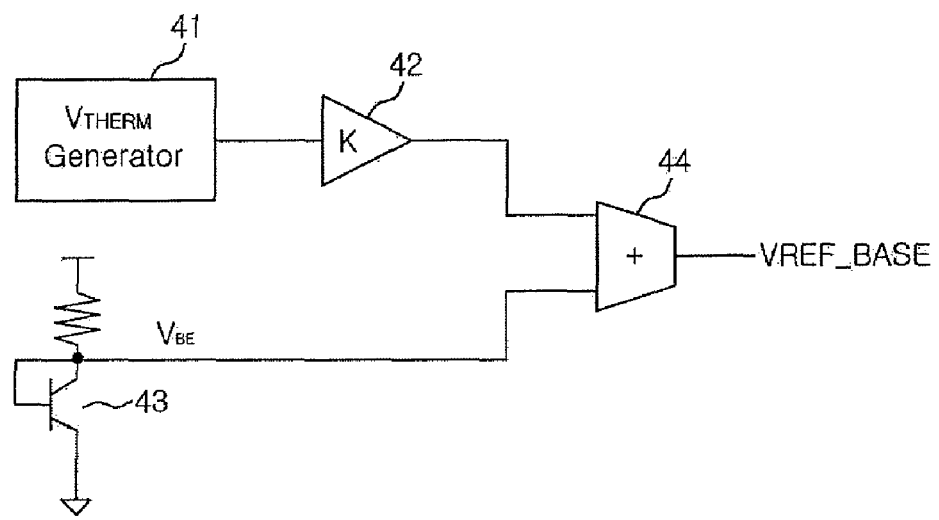
FIG. 9 is a circuit diagram illustrating a variable reference voltage generating unit shown in FIG. 8.

FIG. 9 is a circuit diagram illustrating the variable reference voltage generating unit shown in FIG. 8. FIG. 10 is a circuit diagram illustrating an internal structure of the variable reference voltage generating unit shown in FIG. 8.

An exemplary variable reference voltage generating unit, which may be composed of any one of the temperature-proportion-type reference voltage generating unit, the temperature-inverse-proportion-type reference voltage generating unit, and the temperature-independent-type reference voltage generating unit, includes a voltage generating unit 41 that generates a voltage according to a first temperature coefficient, a multiplier 42 that multiplies the output of the voltage generating unit 41 by a proportional constant K, a bipolar junction transistor BJT 43 that generates a voltage $V_{BE}$ according to a second temperature coefficient, and an adder 44 that adds the output of the multiplier 42 to the output of the BJT 43 and outputs a reference voltage VREF_BASE, as shown in FIG. 9. The reference voltage VREF_BASE is defined by the following Equation 1.

$$VREF\_BASE = V_{BE} + K^* V_{THERM} \qquad \text{Equation 1}$$

In this example, the temperature coefficient of a base-emitter voltage $V_{BE}$ is about −2.2 mV/° C., and the temperature coefficient of a $V_{THERM}$ component is about +0.085 mV/° C. Accordingly, the variable reference voltage generating unit may be composed of any one of the temperature-proportion-type reference voltage generating unit, the temperature-inverse-proportion-type reference voltage generating unit, and the temperature-independent-type reference voltage generating unit by adjusting the proportional constant K.

Figure 10:
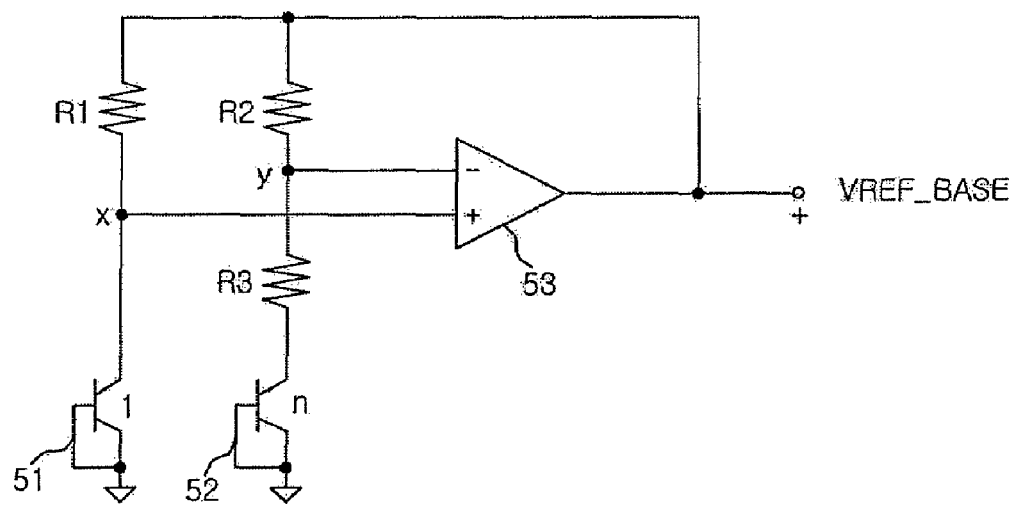
FIG. 10 is a circuit diagram illustrating an internal structure of a variable reference voltage generating unit shown in FIG. 8.

FIG. 10 is a diagram illustrating an example of the variable reference voltage generating unit shown in FIG. 9 applied to an actual circuit. In FIG. 10, the variable reference voltage generating unit has the following structure. The variable reference voltage generating unit includes a first transistor 51, a first resistor R1 that is coupled to an emitter of the first transistor 51, second and third resistors R2 and R3 that are connected in series to each other and coupled in parallel with the first resistor R1, a second transistor 52 that has an emitter coupled to the third resistor R3, and a comparator 53 that has a non-inversion terminal "+" coupled to a connection node X of the first resistor R1 and the emitter of the first transistor 51 and an inversion terminal "−" coupled to a connection node Y of the second resistor R2 and the third resistor R3. The output of the comparator 53 is fed back to the first resistor R1 and the second resistor R2.

The reference voltage VREF_BASE is defined by the following Equation 2.

$$VREF\_BASE = V_{BE} + (1 + R2/R3)\ln(n)^* V_{THERM} \qquad \text{Equation 2}$$

In this example, the 'n' value of the second transistor 52 refers to the ratio of an emitter size to the first transistor 51, and the '(1+R2/R3)ln(n)' value corresponds to the proportional constant 'K' in Equation 1. Therefore, designers may construct a reference voltage generating unit using any one of a temperature-proportion-type reference voltage generating unit, a temperature-inverse-proportion-type reference voltage generating unit, and a temperature-independent-type reference voltage generating unit by adjusting the values of 'R2', 'R3', and 'n'.

Hereinafter, an internal voltage generating apparatus according to each of the preferred embodiments of the present invention will be described with reference to the accompanying drawings.

Figure 11:
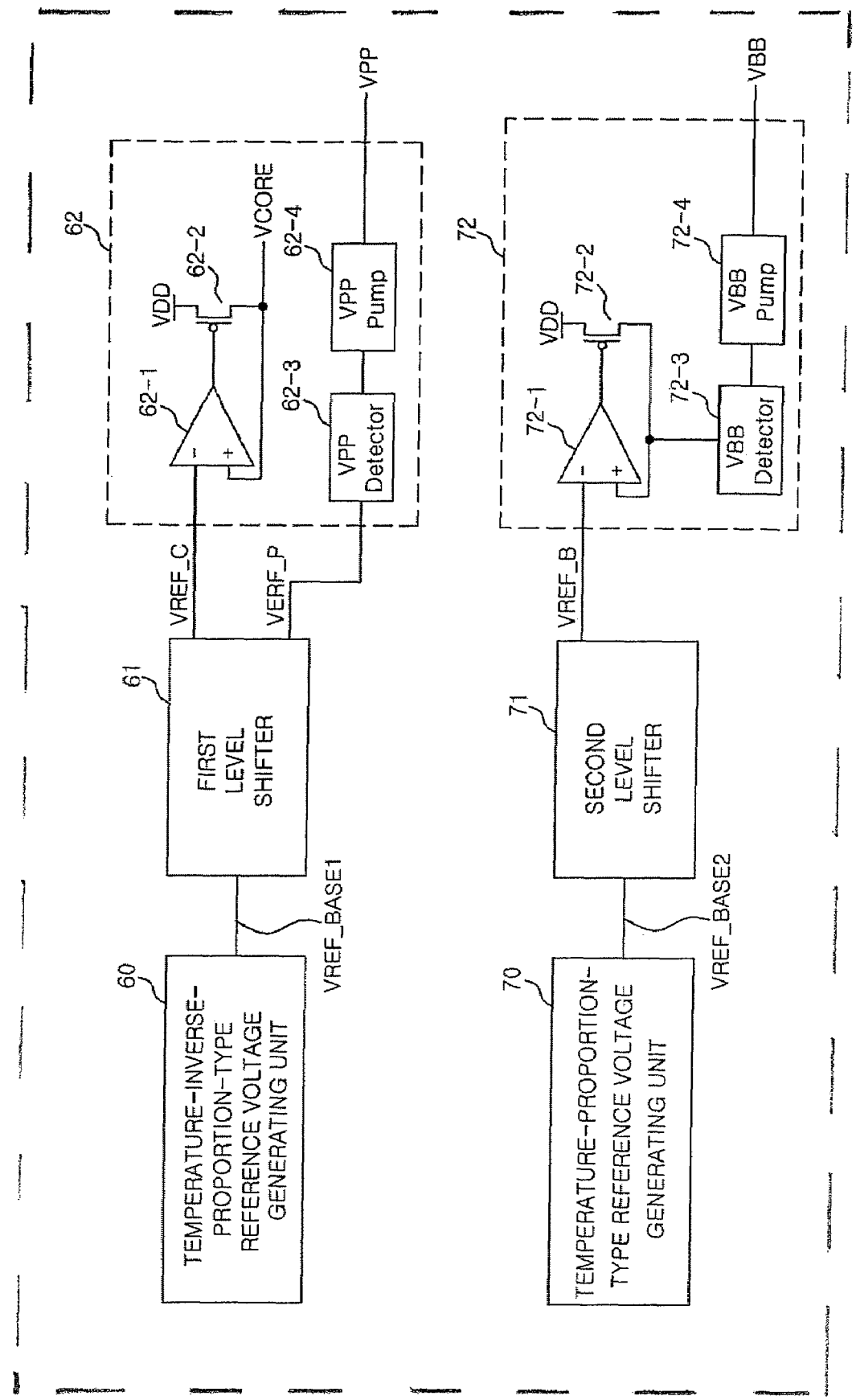
FIG. 11 is a circuit diagram illustrating an internal voltage generator of a semiconductor integrated circuit according to a first embodiment of the present invention.
Figure 12:
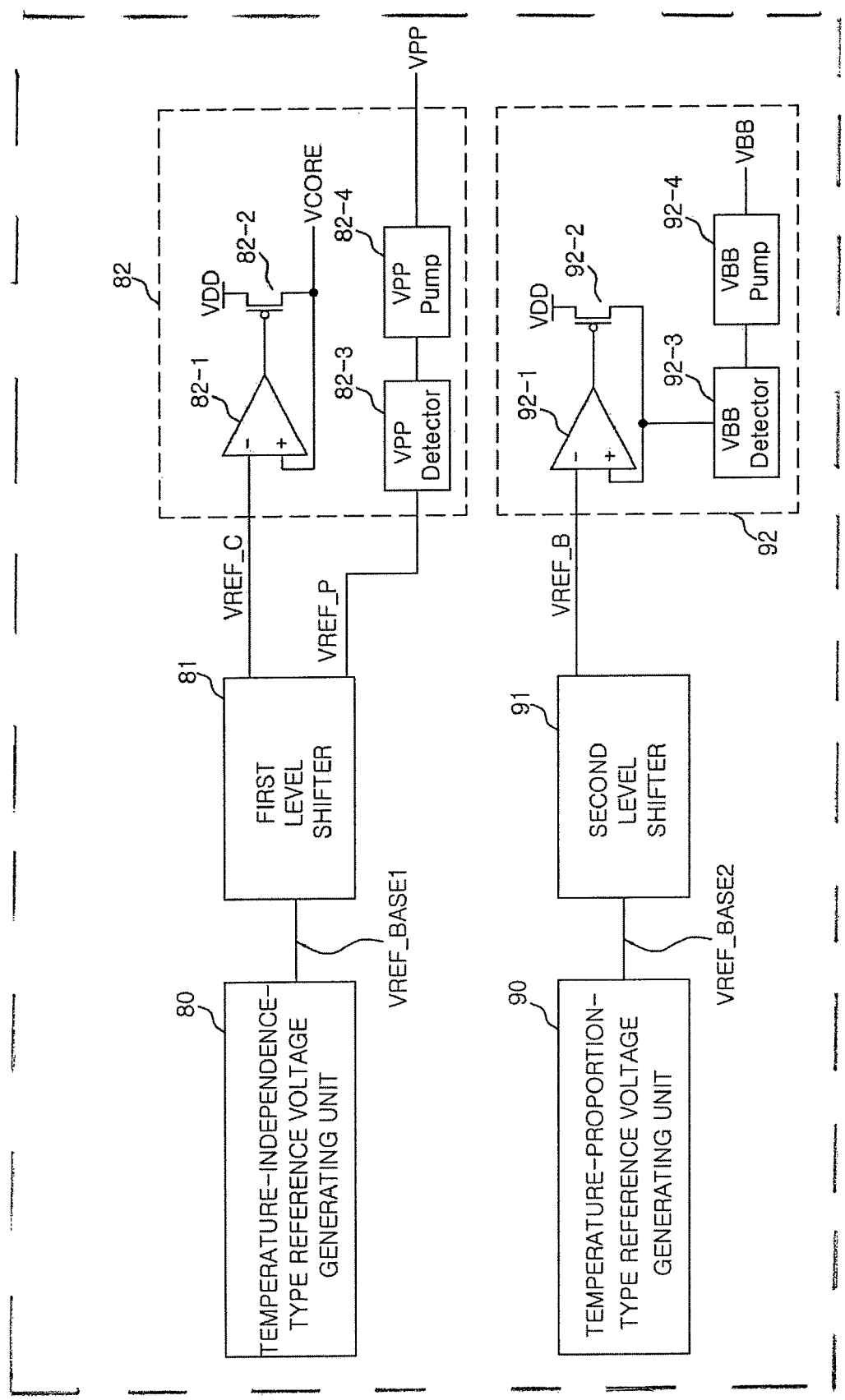
FIG. 12 is a circuit diagram illustrating an internal voltage generator of a semiconductor integrated circuit according to a second embodiment of the present invention.
Figure 13:
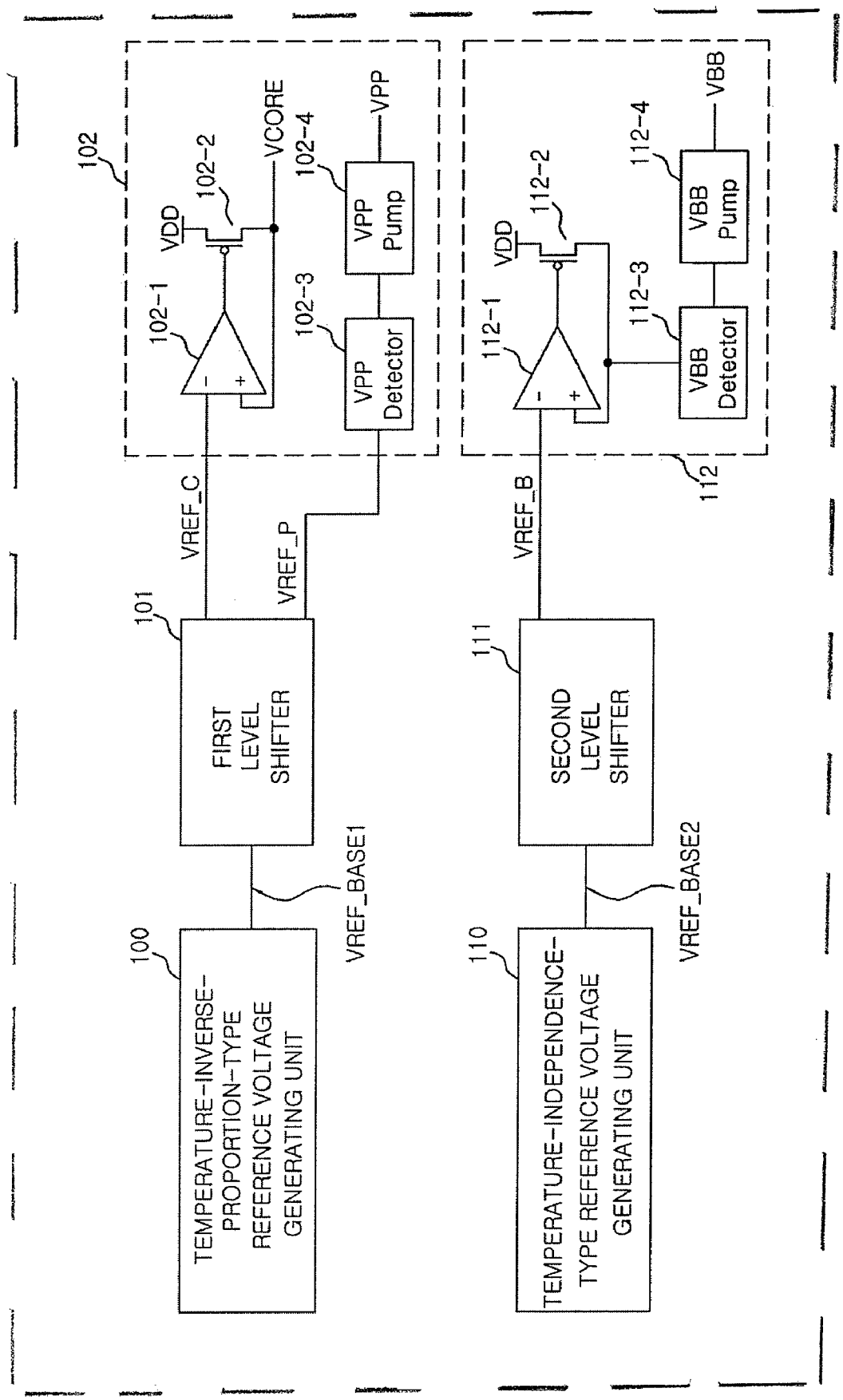
FIG. 13 is a circuit diagram illustrating an internal voltage generator of a semiconductor integrated circuit according to a third embodiment of the present invention.

FIG. 11 is a circuit diagram illustrating an internal voltage generator of a semiconductor integrated circuit according to a first embodiment of the present invention, FIG. 12 is a circuit diagram illustrating an internal voltage generator of a semiconductor integrated circuit according to a second embodiment of the present invention, and FIG. 13 is a circuit diagram illustrating an internal voltage generator of a semiconductor integrated circuit according to a third embodiment of the present invention.

First Embodiment

The first embodiment of the present invention is constructed such that a cell voltage VCORE and an elevated voltage VPP are increased, and a substrate bias voltage VBB is decreased in a low temperature condition.

As shown in FIG. 11, an internal voltage generator of a semiconductor integrated circuit according to the first embodiment of the present invention has the following structure. The internal voltage generator of a semiconductor integrated circuit includes a temperature-inverse-proportion-type reference voltage generating unit 60 that generates a base reference voltage VREF_BASE1 which is increased when the temperature is decreased; a first level shifter 61 that transforms the base reference voltage VREF_BASE1, outputted by the temperature-inverse-proportion-type reference voltage generating unit 60, into a cell voltage generating reference voltage VREF_C and an elevated voltage generating reference voltage VREF_P and outputs these voltages; a first internal voltage generating unit 62 that generates the cell voltage VCORE and the elevated voltage VPP by using the cell voltage generating reference voltage VREF_C and the elevated voltage generating reference voltage VREF_P outputted by the first level shifter 61; a temperature-proportion-type reference voltage generating unit 70 that generates a base reference voltage which is decreased when the temperature is decreased; a second level shifter 71 that transforms a base reference voltage VREF_BASE2, outputted by the temperature-proportion-type reference voltage generating unit 70, into a substrate bias voltage generating reference voltage VREF_B and outputs this reference voltage; and a second internal voltage generating unit 72 that generates the substrate bias voltage VBB using the substrate bias voltage generating reference voltage VREF_B outputted by the second level shifter 71.

The temperature-inverse-proportion-type reference voltage generating unit 60 uses a configuration shown in FIG. 10. According to this configuration, in order to satisfy the temperature-inverse-proportion-type characteristic, the resistances of the second resistor R2 and the third resistor R3, and the emitter size n of the second transistor 52, are adjusted to have a negative temperature coefficient.

The first internal voltage generating unit 62 includes a comparator 62-1 that has an inversion terminal "−" receiving a cell voltage generating reference voltage VREF_C outputted by the first level shifter 61; a transistor 62-2 that has a gate receiving the output of the comparator 62-1, and which outputs a cell voltage VCORE by transforming an external voltage VDD according to the gate voltage level while allowing the cell voltage VCORE to be fed back to the non-inversion terminal "+" of the comparator 62-1, an elevated voltage detector 62-3 that detects the level of an elevated voltage generating reference voltage VREF_P, outputted by the first level shifter 61, and outputs an elevated voltage pump enable signal, and an elevated voltage pump 62-4 that is driven by the elevated voltage pump enable signal and pumps the elevated voltage VPP.

The temperature-proportion-type reference voltage generating unit uses a configuration shown in FIG. 10. According to this configuration, in order to satisfy the temperature-proportion-type characteristic, resistances of the second resistor R2 and the third resistor R3, and the emitter size n of the second transistor 52, are adjusted to have a positive temperature coefficient.

The second internal voltage generating unit 72 includes a comparator 72-1 that has an inversion terminal "−" receiving a substrate bias voltage generating reference voltage VREF_B outputted by the second level shifter 71; a transistor 72-2 that has a gate receiving the output of the comparator 72-1, and which outputs a transformed voltage by transforming an external voltage VDD according to the gate voltage level while allowing the transformed voltage to be fed back to the non-inversion terminal "+" of the comparator 72-1; a substrate bias voltage detector 72-3 that detects the level of a voltage outputted by the transistor 72-2 and outputs a substrate bias voltage pump enable signal; and a substrate bias voltage pump 72-4 that is driven by the substrate bias voltage pump enable signal and pumps the substrate bias voltage VBB.

The operation of the internal voltage generator of a semiconductor integrated circuit according to the first embodiment of the present invention that has the above-described structure is as follows.

First, when the temperature decreases, the temperature-inverse-proportion-type reference voltage generating unit 60 outputs a base reference voltage VREF_BASE1 which is increased from the base reference voltage before the temperature decreases.

Then, the first level shifter 61 transforms the base reference voltage VREF_BASE1 into a cell voltage generating reference voltage VREF_C and an elevated voltage generating reference voltage VREF_P and outputs these voltages.

At this time, since the base reference voltage VREF_BASE1 is increased from an original base reference voltage, the cell voltage generating reference voltage VREF_C and the elevated voltage generating reference voltage VREF_P are also increased in proportion to the increased base reference voltage.

In addition, the first internal voltage generating unit 62 generates a cell voltage VCORE and an elevated voltage VPP by using the cell voltage generating reference voltage VREF_C and the elevated voltage generating reference voltage VREF_P that have been increased.

At this time, since the cell voltage generating reference voltage VREF_C and the elevated voltage generating reference voltage VREF_P are increased, the cell voltage VCORE and the elevated voltage VPP are also increased in proportion to the increased cell voltage generating reference voltage VREF_C and the increased elevated voltage generating reference voltage VREF_P.

In the meantime, as the temperature decreases, the temperature-proportion-type reference voltage generating unit 70 outputs a base reference voltage VREF_BASE2 which is decreased from the base reference voltage before the temperature decreases.

Then, the second level shifter 71 transforms the base reference voltage VREF_BASE2 into a substrate bias voltage generating reference voltage VREF_B and outputs this voltage.

At this time, since the base reference voltage VREF_BASE2 is decreased from an original base reference voltage, the substrate bias voltage generating reference voltage VREF_B is also decreased in proportion to the decreased base reference voltage.

In addition, the second internal voltage generating unit 72 generates a substrate bias voltage VBB by using the decreased substrate bias voltage generating reference voltage VREF_B.

At this time, since the substrate bias voltage generating reference voltage VREF_B is decreased, the substrate bias voltage VBB is also decreased in proportion to the decreased substrate bias voltage generating reference voltage VREF_B.

Therefore, current drivability of an NMOS transistor in a semiconductor integrated circuit cell is lowered in a low temperature condition. However, according to the first embodiment of the present invention, the cell voltage VCORE and the elevated voltage VPP are increased, that is, a driving voltage is increased, so that drivability of the NMOS transistor is improved. In addition, the substrate bias voltage VBB is decreased, that is, the threshold voltage is decreased, so that drivability of the NMOS transistor is improved. As a result, normal operation can occur.

Second Embodiment

The second embodiment of the present invention is constructed such that a cell voltage VCORE and an elevated voltage VPP are maintained at predetermined values, regardless of the variation in temperature, and a substrate bias voltage VBB is decreased.

As shown in FIG. 12, an internal voltage generator of a semiconductor integrated circuit according to the second embodiment of the present invention has the following structure. The internal voltage generator of a semiconductor integrated circuit includes a temperature-independent-type reference voltage generating unit 80 that generates a predetermined base reference voltage VREF_BASE1, regardless of the variation in temperature; a first level shifter 81 that transforms the base reference voltage VREF_BASE1, outputted by the temperature-independent-type reference voltage generating unit 80, into a cell voltage generating reference voltage VREF_C and an elevated voltage generating reference voltage VREF_P and outputs these voltages; a first internal voltage generating unit 82 that generates the cell voltage VCORE and the elevated voltage VPP by using the cell voltage generating reference voltage VREF_C and the elevated voltage generating reference voltage VREF_P outputted by the first level shifter 81; a temperature-proportion-type reference voltage generating unit 90 that generates a base reference voltage which is decreased when the temperature is decreased; a second level shifter 91 that transforms a base reference voltage VREF_BASE2, outputted by the temperature-proportion-type reference voltage generating unit 90, into a substrate bias voltage generating reference voltage VREF_B and outputs this voltage; and a second internal voltage generating unit 92 that generates the substrate bias voltage VBB using the substrate bias voltage generating reference voltage VREF_B outputted by the second level shifter 91.

The temperature-independent-type reference voltage generating unit 80 uses a configuration shown in FIG. 10. According to this configuration, in order to satisfy the temperature-independent-type characteristic, the resistances of the second resistor R2 and the third resistor R3, and the emitter size n of the second transistor 52, are adjusted to have a temperature coefficient of 0.

The first internal voltage generating unit 82 may have the same structure as the first internal voltage generating unit 62 according to the first embodiment of the present invention shown in FIG. 11. Therefore, the detailed description thereof will be omitted.

The temperature-proportion-type reference voltage generating unit 90 uses a configuration shown in FIG. 10. According to this configuration, in order to satisfy the temperature-proportion-type characteristic, the resistances of the second resistor R2 and the third resistor R3, and the emitter size n of the second transistor 52 are adjusted to have a positive temperature coefficient.

The second internal voltage generating unit 92 may have the same structure as the second internal voltage generating unit 72 according to the first embodiment of the present invention shown in FIG. 11. Therefore, the detailed description thereof will be omitted.

The operation of the internal voltage generator of a semiconductor integrated circuit according to the second embodiment of the present invention having the above-described structure is as follows.

First, the temperature-independent-type reference voltage generating unit 80 outputs a predetermined base reference voltage VREF_BASE1, regardless of the variation in temperature.

Then, the first level shifter 81 transforms the base reference voltage VREF_BASE1 into a cell voltage generating reference voltage VREF_C and an elevated voltage generating reference voltage VREF_P and outputs these voltages.

At this time, since the base reference voltage VREF_BASE1 is constant, regardless of the variation in temperature, each of the cell voltage generating reference voltage VREF_C and the elevated voltage generating reference voltage VREF_P is also maintained at a predetermined output level in proportion to the base reference voltage.

In addition, the first internal voltage generating unit 82 generates a cell voltage VCORE and an elevated voltage VPP by using the cell voltage generating reference voltage VREF_C and the elevated voltage generating reference voltage VREF_P.

At this time, since each of the cell voltage generating reference voltage VREF_C and the elevated voltage generating reference voltage VREF_P is constant, each of the cell voltage VCORE and the elevated voltage VPP is also maintained at a predetermined output level.

In the meantime, when the temperature decreases, the temperature-proportion-type reference voltage generating unit 90 outputs a base reference voltage VREF_BASE2 which is decreased from the base reference voltage before the temperature decreases.

Then, the second level shifter 91 transforms the base reference voltage VREF_BASE2 into a substrate bias voltage generating reference voltage VREF_B and outputs this voltage.

At this time, since the base reference voltage VREF_BASE2 is decreased from an original base reference voltage, the substrate bias voltage generating reference voltage VREF_B is also decreased in proportion to the decreased base reference voltage.

In addition, the second internal voltage generating unit 92 generates a substrate bias voltage VBB by using the decreased substrate bias voltage generating reference voltage VREF_B.

At this time, since the substrate bias voltage generating reference voltage VREF_B is decreased, the substrate bias voltage VBB is also decreased in proportion to the decreased substrate bias voltage generating reference voltage VREF_B.

Therefore, current drivability of an NMOS transistor in a semiconductor integrated circuit cell is lowered in a low temperature condition. However, according to the second embodiment of the present invention, the substrate bias voltage VBB is decreased, that is, the threshold voltage is decreased, so that drivability of the NMOS transistor is improved, which allows the normal operation to occur.

Third Embodiment

The third embodiment of the present invention is constructed such that a cell voltage VCORE and an elevated voltage VPP are increased in a low temperature condition and a substrate bias voltage VBB is maintained at a predetermined value, regardless of the variation in temperature.

As shown in FIG. 13, an internal voltage generator of a semiconductor integrated circuit according to the third embodiment of the present invention has the following structure. The internal voltage generator of a semiconductor integrated circuit includes a temperature-inverse-proportion-type reference voltage generating unit 100 that generates a base reference voltage VREF_BASE1 increased when the temperature is decreased; a first level shifter 101 that transforms the base reference voltage VREF_BASE1, outputted by the temperature-inverse-proportion-type reference voltage generating unit 100, into a cell voltage generating reference voltage VREF_C and an elevated voltage generating reference voltage VREF_P and outputs these voltages; a first internal voltage generating unit 102 that generates the cell voltage VCORE and the elevated voltage VPP by using the cell voltage generating reference voltage VREF_C and the elevated voltage generating reference voltage VREF_P outputted by the first level shifter 101; a temperature-independent-type reference voltage generating unit 110 that generates a predetermined base reference voltage, regardless of the variation in temperature; a second level shifter 111 that transforms a base reference voltage VREF_BASE2, outputted by the temperature-independent-type reference voltage generating unit 110, into a substrate bias voltage generating reference voltage VREF_B and outputs this voltage; and a second internal voltage generating unit 112 that generates the substrate bias voltage VBB using the substrate bias voltage generating reference voltage VREF_B outputted by the second level shifter 111.

The temperature-inverse-proportion-type reference voltage generating unit 100 uses a configuration shown in FIG. 10. According to this configuration, in order to satisfy the temperature-inverse-proportion-type characteristic, the resistances of the second resistor R2 and the third resistor R3, and the emitter size n of the second transistor 52, are adjusted to have a negative temperature coefficient.

The first internal voltage generating unit 102 may have the same structure as the first internal voltage generating unit 62 according to the first embodiment of the present invention shown in FIG. 11. Therefore, the detailed description thereof will be omitted.

The temperature-independent-type reference voltage generating unit 110 uses a configuration shown in FIG. 10. According to this configuration, in order to satisfy the temperature-independent-type characteristic, the resistances of the second resistor R2 and the third resistor R3, and the emitter size n of the second transistor 52, are adjusted to have a temperature coefficient of 0.

The second internal voltage generating unit 112 may have the same structure as the second internal voltage generating unit 72 according to the first embodiment of the present invention shown in FIG. 11. Therefore, the detailed description thereof will be omitted.

The operation of the internal voltage generator of a semiconductor integrated circuit according to the third embodiment of the present invention that has the above-described structure is as follows.

First, when the temperature decreases, the temperature-inverse-proportion-type reference voltage generating unit 100 outputs a base reference voltage VREF_BASE1 which is increased from the base reference voltage before the temperature decreases.

Then, the first level shifter 101 transforms the base reference voltage VREF_BASE1 into a cell voltage generating reference voltage VREF_C and an elevated voltage generating reference voltage VREF_P and outputs these voltages.

At this time, since the base reference voltage VREF_BASE1 is increased from the original base reference voltage, the cell voltage generating reference voltage VREF_C and the elevated voltage generating reference voltage VREF_P are also increased in proportion to the increased base reference voltage.

In addition, the first internal voltage generating unit 102 generates a cell voltage VCORE and an elevated voltage VPP by using the increased cell voltage generating reference voltage VREF_C and the increased elevated voltage generating reference voltage VREF_P.

At this time, since the cell voltage generating reference voltage VREF_C and the elevated voltage generating reference voltage VREF_P are increased, the cell voltage VCORE and the elevated voltage VPP are also increased in proportion to the increased cell voltage generating reference voltage VREF_C and the increased elevated voltage generating reference voltage VREF_P.

Meanwhile, the temperature-independent-type reference voltage generating unit 110 outputs a predetermined base reference voltage VREF_BASE2, regardless of the variation in temperature.

Then, the second level shifter 111 transforms the base reference voltage VREF_BASE2 into a substrate bias voltage generating reference voltage VREF_B and outputs this voltage.

At this time, since the base reference voltage VREF_BASE2 is constant, regardless of the variation in temperature, the substrate bias voltage generating reference voltage VREF_B is also maintained at a predetermined level in proportion to the base reference voltage.

In addition, the second internal voltage generating unit 112 generates the substrate bias voltage VBB by using the substrate bias voltage generating reference voltage VREF_B.

At this time, since the substrate bias voltage generating reference voltage VREF_B is constant, the substrate bias voltage VBB is also maintained at a predetermined level in proportion to the substrate bias voltage generating reference voltage VREF_B.

Therefore, current drivability of an NMOS transistor in a semiconductor integrated circuit cell is lowered in a low temperature condition. However, according to the third embodiment of the present invention, the cell voltage VCORE and the elevated voltage VPP are increased, that is, the driving voltage is increased, so that the drivability of the NMOS transistor is improved. In addition, the substrate bias voltage VBB is prevented from increasing, that is, the threshold voltage is prevented from increasing, so that the drivability of the NMOS transistor is improved, which allows the normal operation to occur.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and all changes and modifications that fall within the metes and bounds of the claims, or equivalents of such metes and bounds are therefore intended to be embraced by the claims.

According to the embodiments of the present invention, the internal voltage generator of a semiconductor integrated circuit can control the elevated voltage, the cell voltage, and the substrate bias voltage independently according to the temperature conditions. Therefore, the internal voltage generator of a semiconductor integrated circuit can achieve the following effects.

First, it is possible to prevent the performance of the semiconductor integrated circuit from being lowered due to the variation in temperature.

Second, it is possible to design a semiconductor integrated circuit which is not affected by the variation in element characteristic; that is, enables the normal operation to be performed in severe environmental variations.

What is claimed is:

1. An internal voltage generator of a semiconductor integrated circuit comprising:
   a temperature-inverse-proportion-type reference voltage generating unit configured to generate a first reference voltage that is increased according to a decrease in temperature;
   a first internal voltage generating unit configured to generate a first internal voltage using the first reference voltage;
   a temperature-proportion-type reference voltage generating unit configured to generate a second reference voltage that is decreased according to a decrease in temperature; and
   a second internal voltage generating unit configured to generate a second internal voltage using the second reference voltage.

2. The internal voltage generator of a semiconductor integrated circuit of claim 1,
   wherein the first internal voltage comprises cell voltage or elevated voltage, and the second internal voltage comprises substrate bias voltage.

3. The internal voltage generator of a semiconductor integrated circuit of claim 1,
   wherein the temperature-inverse-proportion-type reference voltage generating unit includes:
   a first transistor having an emitter;
   a first resistor, coupled to the emitter of the first transistor at a first connection node;
   second and third resistors coupled in series to each other at a second connection node;
   a second transistor having an emitter coupled to the third resistor; and
   a comparator having a non-inversion terminal coupled to the first connection node and an inversion terminal coupled to the second connection node, and an output terminal coupled to the first resistor and the second resistor.

4. The internal voltage generator of a semiconductor integrated circuit of claim 3,
   wherein the resistances of the second resistor and the third resistor, and a size of the second transistor are selected such that temperature-inverse-proportion-type reference voltage generating unit has a negative temperature coefficient.

5. The internal voltage generator of a semiconductor integrated circuit of claim 1,
   wherein the temperature-proportion-type reference voltage generating unit includes:
   a first transistor having an emitter:
   a first resistor, coupled to the emitter of the first transistor at a first connection node;
   second and third resistors coupled in series with each other at a second connection node and that are coupled in parallel to the first resistor;
   a second transistor having an emitter coupled to the third resistor; and
   a comparator having a non-inversion terminal coupled to the first connection node and an inversion terminal coupled to the second connection node of the second resistor and the third resistor, and an output terminal coupled to the first resistor and the second resistor.

6. The internal voltage generator of a semiconductor integrated circuit of claim 5,
   wherein resistances of the second resistor and the third resistor, and a size of the second transistor are selected such that the temperature-proportion-type reference voltage generating unit has a positive temperature coefficient.

7. The internal voltage generator of a semiconductor integrated circuit of claim 2,
   wherein the first internal voltage generating unit includes:
   a comparator having an inversion terminal and a non-inversion terminal and configured to receive the first reference voltage through the inversion terminal and to generate an output;
   a transistor having a gate and adapted to receive the output of the comparator though the gate, and transform the external voltage according to a voltage level at the gate to output the cell voltage, and wherein the cell voltage is provided to the non-inversion terminal of the comparator;
   an elevated voltage detector configured to detect a level of a divided voltage of the first reference voltage and to output an elevated voltage pump enable signal; and
   an elevated voltage pump configured to pump the elevated voltage according to the elevated voltage pump enable signal.

8. The internal voltage generator of a semiconductor integrated circuit of claim 2,
   wherein the second internal voltage generating unit includes:
   a comparator having an inversion terminal and a non-inversion terminal and configured to receive the second reference voltage though the inversion terminal and to generate an output;
   a transistor having a gate and adapted to receive the output of the comparator though the gate, and transform the external voltage according to a voltage level at the gate to output the cell voltage, and wherein the cell voltage is provided to the non-inversion terminal of the comparator;
   an elevated voltage detector configured to detect an output level of the transistor and to output an substrate bias voltage pump enable signal; and
   an substrate bias voltage pump configured to pump the elevated voltage according to the substrate bias voltage pump enable signal.

9. An internal voltage generator of a semiconductor integrated circuit comprising:
   a temperature-independent-type reference voltage generating unit configured to generate a first reference voltage regardless of a variation in temperature;
   a first internal voltage generating unit configured to generate a first internal voltage using the first reference voltage;

a temperature-proportion-type reference voltage generating unit configured to generate a second reference voltage that is decreased according to a decrease in temperature; and a second internal voltage generating unit configured to generate a second internal voltage using the second reference voltage, wherein the first internal voltage comprises cell voltage or elevated voltage, and the second internal voltage comprises substrate bias voltage.

10. The internal voltage generator of a semiconductor integrated circuit of claim 9, wherein the temperature-independent-type reference voltage generating unit includes:

a first transistor having an emitter;

a first resistor, coupled to the emitter of the first transistor at a first connection node;

second and third resistors coupled in series to each other at a second connection node;

a second transistor having an emitter coupled to the third resistor; and a comparator having a non-inversion terminal coupled to the first connection node and an inversion terminal coupled to the second connection node, and an output terminal coupled to the first resistor and the second resistor.

11. The internal voltage generator of a semiconductor integrated circuit of claim 10, wherein the resistances of the second resistor and the third resistor, and a size of the second transistor are selected such that the temperature-independent-type reference voltage generating unit has a zero temperature coefficient.

12. The internal voltage generator of a semiconductor integrated circuit of claim 9, wherein the temperature-proportion-type reference voltage generating unit includes:

a first transistor having an emitter:

a first resistor, coupled to the emitter of the first transistor at a first connection node;

second and third resistors coupled in series with each other at a second connection node and that are coupled in parallel to the first resistor;

a second transistor having an emitter coupled to the third resistor; and a comparator having a non-inversion terminal coupled to the first connection node and an inversion terminal coupled to the second connection node of the second resistor and the third resistor, and an output terminal coupled to the first resistor and the second resistor.

13. The internal voltage generator of a semiconductor integrated circuit of claim 12, wherein resistances of the second resistor and the third resistor, and a size of the second transistor are selected such that the temperature-proportion-type reference voltage generating unit has a positive temperature coefficient.

14. The internal voltage generator of a semiconductor integrated circuit comprising:

a temperature-inverse-proportion-type reference voltage generating unit configured to generate a first reference voltage that increases based on a decrease in temperature;

a first internal voltage generating unit configured to generate a first internal voltage using the first reference voltage;

a temperature-independent-type reference voltage generating unit configured to generate a second reference voltage regardless of a variation in temperature; and a second internal voltage generating unit configured to generate a second internal voltage using the second reference voltage.

15. The internal voltage generator of a semiconductor integrated circuit of claim 14, wherein the temperature-inverse-proportion-type reference voltage generating unit includes:

a first transistor having an emitter;

a first resistor, coupled to the emitter of the first transistor at a first connection node;

second and third resistors coupled in series to each other at a second connection node;

a second transistor having an emitter coupled to the third resistor; and a comparator having a non-inversion terminal coupled to the first connection node and an inversion terminal coupled to the second connection node, and an output terminal coupled to the first resistor and the second resistor.

16. The internal voltage generator of a semiconductor integrated circuit of claim 15, wherein the resistances of the second resistor and the third resistor, and a size of the second transistor are selected such that the temperature-inverse-proportion-type reference voltage generating unit has a negative temperature coefficient.

17. The internal voltage generator of a semiconductor integrated circuit of claim 14, wherein the temperature-independent-type reference voltage generating unit includes:

a first transistor having an emitter;

a first resistor, coupled to the emitter of the first transistor at a first connection node;

second and third resistors coupled in series to each other at a second connection node;

a second transistor having an emitter coupled to the third resistor; and a comparator having a non-inversion terminal coupled to the first connection node and an inversion terminal coupled to the second connection node, and an output terminal coupled to the first resistor and the second resistor.

18. The internal voltage generator of a semiconductor integrated circuit of claim 17, wherein the resistances of the second resistor and the third resistor, and a size of the second transistor are selected such that the temperature-independent-type reference voltage generating unit has a zero temperature coefficient.

* * * * *